United States Patent
Zhai et al.

(10) Patent No.: US 12,076,763 B2
(45) Date of Patent: Sep. 3, 2024

(54) SELECTIVE IN-SITU CLEANING OF HIGH-K FILMS FROM PROCESSING CHAMBER USING REACTIVE GAS PRECURSOR

(71) Applicant: Applied Materials, Inc., Santa Clara, CA (US)

(72) Inventors: Yujia Zhai, Fremont, CA (US); Lai Zhao, Campbell, CA (US); Xiangxin Rui, Campbell, CA (US); Dong-Kil Yim, Pleasanton, CA (US); Tae Kyung Won, San Jose, CA (US); Soo Young Choi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 420 days.

(21) Appl. No.: 16/007,876

(22) Filed: Jun. 13, 2018

(65) Prior Publication Data

US 2018/0345330 A1   Dec. 6, 2018

Related U.S. Application Data

(63) Continuation-in-part of application No. 15/700,671, filed on Sep. 11, 2017, now abandoned, and a
(Continued)

(51) Int. Cl.
*B08B 7/00* (2006.01)
*B08B 9/00* (2006.01)
(Continued)

(52) U.S. Cl.
CPC ............. *B08B 7/0035* (2013.01); *B08B 9/00* (2013.01); *C23C 16/4405* (2013.01);
(Continued)

(58) Field of Classification Search
CPC ..... B08B 7/0035; B08B 9/00; C23C 16/4405; H01J 2237/335; H01J 37/32082;
(Continued)

(56) References Cited

U.S. PATENT DOCUMENTS

| | | |
|---|---|---|
| 7,357,138 B2 | 4/2008 | Ji et al. |
| 8,999,847 B2 | 4/2015 | Furuta et al. |

(Continued)

FOREIGN PATENT DOCUMENTS

| | | |
|---|---|---|
| CN | 1638028 A | 7/2005 |
| CN | 102414799 A | 4/2012 |

(Continued)

OTHER PUBLICATIONS

JP06136544A machine translation (Year: 1994).*
(Continued)

*Primary Examiner* — Douglas Lee
(74) *Attorney, Agent, or Firm* — Patterson + Sheridan, LLP (57) ABSTRACT

In one implementation, a method for cleaning a processing chamber is provided. The method comprises introducing a reactive species into a processing chamber having a residual high-k dielectric material formed on one or more interior surfaces of the processing chamber. The reactive species is formed from a halogen-containing gas mixture and the one or more interior surfaces include at least one surface having a coating material formed thereon. The method further comprises reacting the residual high-k dielectric material with the reactive species to form a volatile product. The method further comprises removing the volatile product from the processing chamber. The removal rate of the residual high-k dielectric material is greater than a removal rate of the coating material. The high-k dielectric material is selected from zirconium dioxide ($ZrO_2$) and hafnium diox-
(Continued)

ide ($HfO_2$). The coating material includes a compound selected from alumina ($Al_2O_3$), yttrium-containing compounds, and combinations thereof.

20 Claims, 4 Drawing Sheets

Related U.S. Application Data continuation-in-part of application No. 15/613,862, filed on Jun. 5, 2017, now abandoned.

(51) Int. Cl.
| | |
|---|---|
| C23C 16/44 | (2006.01) |
| H01J 37/32 | (2006.01) |
| H01L 21/02 | (2006.01) |
| H01L 21/687 | (2006.01) |
| H01L 27/12 | (2006.01) |
| H01L 29/49 | (2006.01) |
| H01L 49/02 | (2006.01) |

(52) U.S. Cl.
CPC .... *H01J 37/32082* (2013.01); *H01L 27/1255* (2013.01); *H01L 29/4908* (2013.01); *H01J 2237/335* (2013.01); *H01L 21/02181* (2013.01); *H01L 21/02189* (2013.01); *H01L 21/68742* (2013.01); *H01L 28/40* (2013.01)

(58) Field of Classification Search
CPC ......... H01L 21/02181; H01L 21/02189; H01L 27/1255; H01L 28/40; H01L 21/68742; H01L 29/4908
See application file for complete search history.

(56) References Cited

U.S. PATENT DOCUMENTS

| | | | |
|---|---|---|---|
| 2001/0003271 A1 | 6/2001 | Otsuki | |
| 2004/0129671 A1* | 7/2004 | Ji | C23C 16/4405 216/58 |
| 2005/0028927 A1 | 2/2005 | Basceri et al. | |
| 2005/0108892 A1 | 5/2005 | Wu et al. | |
| 2007/0042601 A1 | 2/2007 | Wang et al. | |
| 2007/0087579 A1 | 4/2007 | Kitayama et al. | |
| 2008/0160777 A1* | 7/2008 | Ono | H01L 21/31116 438/710 |
| 2009/0071505 A1 | 3/2009 | Miya et al. | |
| 2009/0233113 A1 | 9/2009 | Hisamoto | |
| 2011/0052833 A1* | 3/2011 | Hanawa | H01L 21/67115 427/534 |
| 2012/0118510 A1* | 5/2012 | Banda | H01J 37/32082 156/704 |
| 2013/0115778 A1 | 5/2013 | Xue et al. | |
| 2014/0030486 A1* | 1/2014 | Sun | C04B 41/87 428/148 |
| 2014/0318575 A1* | 10/2014 | Parkhe | C04B 35/44 134/1.1 |
| 2015/0079370 A1 | 3/2015 | Sun et al. | |
| 2015/0376780 A1 | 12/2015 | Khaja et al. | |
| 2016/0118268 A1 | 4/2016 | Ingle et al. | |

FOREIGN PATENT DOCUMENTS

| | | | |
|---|---|---|---|
| CN | 104704606 A | | 6/2015 |
| JP | 06136544 A | * | 5/1994 |
| KR | 1020000062949 | | 10/2000 |
| KR | 20040074681 A | | 8/2004 |
| KR | 20050050579 A | | 5/2005 |

OTHER PUBLICATIONS

JP06136544A Abstract (Year: 1994).*
International Search Report and Written Opinion for International Application No. PCT/US2018/050186 dated Jan. 2, 2019.
PCT International Search Report dated Aug. 10, 2018 for Application No. PCT/US2018/030213.
Office Action for Korean Application No. 10-2019-7038831 dated Jul. 30, 2021.
Korean Final Office Action issued to Application No. 10-2020-7010087 on Apr. 26, 2022, 6 pages.
Korean Office Action dated Dec. 30, 2022 for Application No. 10-2022-7039605.
Chinese Office Action dated Mar. 15, 2023, for Appln. No. 201880058910.1.
Korean Office Action dated Aug. 10, 2022 for Application No. 10-2020-7010087.
Korean Application No. 1020227039605, Office Action dated Sep. 24, 2023, 4 pages.
Korean Application No. 10-2022-7039605, Office Action dated Jun. 24, 2024, 6 pages.

* cited by examiner

SELECTIVE IN-SITU CLEANING OF HIGH-K FILMS FROM PROCESSING CHAMBER USING REACTIVE GAS PRECURSOR

CROSS-REFERENCE TO RELATED APPLICATIONS

This application is a continuation-in-part of co-pending U.S. patent application Ser. No. 15/700,671, filed Sep. 11, 2017 and is a continuation-in-part of co-pending U.S. patent application Ser. No. 15/613,862, filed Jun. 5, 2017, both of which are incorporated herein by reference in their entirety.

BACKGROUND

Field

Implementations described herein generally relate to methods and apparatus for in-situ removal of unwanted deposition buildup from one or more interior surfaces of a substrate-processing chamber.

Description of the Related Art

Display devices have been widely used for a range of electronic applications, such as TVs, monitors, mobile phones, MP3 players, e-book readers, personal digital assistants (PDAs) and the like. The display device is generally designed for producing an image by applying an electric field to a liquid crystal that fills a gap between two substrates (e.g., a pixel electrode and a common electrode) and has anisotropic dielectric constant that controls the intensity of the dielectric field. By adjusting the amount of light transmitted through the substrates, the light and image intensity, quality and power consumption may be efficiently controlled.

A variety of different display devices, such as active matrix liquid crystal display (AMLCD) or an active matrix organic light emitting diodes (AMOLED), may be employed as light sources for display. In the manufacturing of display devices, an electronic device with high electron mobility, low leakage current and high breakdown voltage, would allow more pixel area for light transmission and integration of circuitry, resulting in a brighter display, higher overall electrical efficiency, faster response time and higher resolution displays. Low film qualities of the material layers, such as dielectric layer with impurities or low film densities, formed in the device often result in poor device electrical performance and short service life of the devices. Thus, a stable and reliable method for forming and integrating film layers within TFT and OLED devices becomes crucial to providing a device structure with low film leakage and high breakdown voltage for use in manufacturing electronic devices with lower threshold voltage shift and improved overall performance.

In particular, the interface management between a metal electrode layer and the nearby insulating materials becomes critical as improper material selection of the interface between the metal electrode layer and the nearby insulating material may adversely result in undesired elements diffusing into the adjacent materials, which may eventually lead to current short, current leakage or device failure. Furthermore, the insulating materials with different higher dielectric constant often provide different electrical performance, such as providing different capacitance in the device structures. Selection of the material of the insulating materials not only affects the electrical performance of the device, incompatibility of the material of the insulating materials to the electrodes may also result in film structure peeling, poor interface adhesion, or interface material diffusion, which may eventually lead to device failure and low product yield.

In some devices, capacitors, (e.g., a dielectric layer placed between two electrodes), are often utilized and formed to store electric charges when the display devices are in operation. The capacitor as formed is required to have high capacitance for display devices. The capacitance may be adjusted by changing the dielectric material and dimensions of the dielectric layer formed between the electrodes and/or thickness of the dielectric layer. For example, when the dielectric layer is replaced with a material having a higher dielectric constant (e.g., zirconium oxide), the capacitance of the capacitor will increase as well.

As the resolution requirement for display devices becomes increasingly challenging, e.g., display resolution greater than 2,000 pixels per inch (PPI), display devices have a limited area for forming capacitors to increase electrical performance. Thus, maintaining the capacitor formed in the display devices in a confined location with a relatively small area has become crucial. Higher constant ("high-k") dielectric materials (e.g., zirconium oxide and hafnium oxide) have been found to enable higher resolution display devices. However, deposition of high-k dielectric materials is not limited to the substrate and often forms a residual film throughout the interior of the processing chamber. Such unwanted residual deposition often creates particles and flakes within the chamber, resulting in the drift of process conditions, which affects the process reproducibility and uniformity.

In order to achieve high chamber availability while reducing the cost of ownership for production and maintaining film quality, a chamber clean is performed to remove residual film residue from the interior surfaces of the processing chamber including the process kits, e.g., showerhead, etc. Unfortunately, most known cleaning techniques such as fluorine-containing plasmas are either unable to remove high-k dielectric materials or are so harsh that they damage chamber components. Thus, viable in-situ cleaning techniques for high-k dielectric materials are currently unavailable. Currently, zirconium oxide is removed from processing chambers using ex-situ cleaning processes where production is stopped, the processing chamber is opened, and the chamber parts are removed for cleaning and cleaned using wet-clean processes.

Therefore, a need exists for methods for in-situ removal of unwanted high-k dielectric material deposits from substrate-processing chambers.

SUMMARY

Implementations described herein generally relate to methods and apparatus for in-situ removal of unwanted deposition buildup from one or more interior surfaces of a substrate-processing chamber. In one implementation, a method for cleaning a processing chamber is provided. The method comprises introducing a reactive species into a processing chamber having a residual high-k dielectric material formed on one or more interior surfaces of the processing chamber. The reactive species are formed from a halogen-containing gas mixture. The one or more interior surfaces includes at least one stainless steel surface. The method further comprises reacting the residual high-k dielectric material with the reactive species to form a volatile product. The method further comprises removing the volatile product from the processing chamber. A removal rate of the residual high-k dielectric material is greater than a removal rate of the stainless steel. The high-k dielectric material is selected from zirconium dioxide ($ZrO_2$) and hafnium dioxide ($HfO_2$).

In another implementation, a method for cleaning a processing chamber is provided. The method comprises depositing a high-k dielectric material on one or more interior surfaces of a processing chamber and a substrate disposed in the substrate-processing chamber. The method further comprises transferring the substrate out of the substrate-processing chamber. The method further comprises introducing a reactive species into the processing chamber having the residual high-k dielectric material formed on one or more interior surfaces of the processing chamber. The reactive species are formed from a halogen-containing gas mixture and the one or more interior surfaces includes at least one stainless steel surface and at least one surface having a coating material formed thereon. The method further comprises reacting the residual high-k dielectric material with the reactive species to form a volatile product. The method further comprises removing the volatile product from the processing chamber, wherein a removal rate of the residual high-k dielectric material is greater than a removal rate of the coating material and a removal rate of the stainless steel. The high-k dielectric material is selected from zirconium dioxide ($ZrO_2$) and hafnium dioxide ($HfO_2$). The coating material includes a compound selected from alumina ($Al_2O_3$), yttrium-containing compounds, and combinations thereof.

In yet another implementation, a method for cleaning a processing chamber is provided. The method comprises flowing a halogen-containing cleaning gas mixture into a remote plasma source fluidly coupled with a processing chamber. The method further comprises forming reactive species from the halogen-containing cleaning gas mixture. The method further comprises transporting the reactive species into the processing chamber. The processing chamber has a residual high-k dielectric material formed on one or more interior surfaces of the processing chamber. The one or more interior surfaces include at least one stainless steel surface and at least one surface having a coating material formed thereon. The method further comprises permitting the reactive species to react with the residual high-k dielectric material to form a product in a gaseous state. The method further comprises purging the product in a gaseous state out of the processing chamber. The high-k dielectric material is selected from zirconium dioxide ($ZrO_2$) and hafnium dioxide ($HfO_2$). The coating material includes a compound selected from alumina ($Al_2O_3$), yttrium-containing compounds, and combinations thereof.

In yet another implementation, a method for cleaning a processing chamber is provided. The method comprises introducing a reactive species into a processing chamber having a residual $ZrO_2$ containing film formed on one or more interior surfaces of the processing chamber. The reactive species are formed from $BCl_3$ and the one or more interior surfaces include at least one exposed $Al_2O_3$ surface. The method further comprises reacting the residual $ZrO_2$ containing film with the reactive species to form a volatile product. The method further comprises removing the volatile product from the processing chamber, wherein a removal rate of the residual $ZrO_2$ containing film is greater than a removal rate of $Al_2O_3$.

In yet another implementation, a method for cleaning a processing chamber is provided. The method comprises depositing a $ZrO_2$ containing film on one or more interior surface of a processing chamber and a substrate disposed in the substrate-processing chamber. The method further comprises transferring the substrate out of the substrate-processing chamber. The method further comprises introducing a reactive species into the processing chamber having the residual $ZrO_2$ containing film formed on one or more interior surfaces of the processing chamber. The reactive species are formed from $BCl_3$ and the one or more interior surfaces include at least one exposed $Al_2O_3$ surface. The method further comprises reacting the residual $ZrO_2$ containing film with the reactive species to form a volatile product. The method further comprises removing the volatile product from the processing chamber, wherein a removal rate of the residual $ZrO_2$ containing film is greater than a removal rate of $Al_2O_3$.

In yet another implementation, a method for cleaning a processing chamber is provided. The method comprises flowing a boron trichloride ($BCl_3$) containing cleaning gas mixture into a remote plasma source fluidly coupled with a processing chamber. The method further comprises forming reactive species from the $BCl_3$ containing cleaning gas mixture. The method further comprises transporting the reactive species into the processing chamber. The processing chamber has a residual $ZrO_2$ containing film formed on one or more interior surfaces of the processing chamber and the one or more interior surfaces includes at least one exposed $Al_2O_3$ surface. The method further comprises permitting the reactive species to react with the residual $ZrO_2$ containing film to form zirconium chloride in a gaseous state. The method further comprises purging the zirconium chloride in a gaseous state out of the processing chamber.

In yet another implementation, a method for cleaning a processing chamber is provided. The method comprises introducing a reactive species into a processing chamber having a residual high-k dielectric material formed on one or more interior surfaces of the processing chamber. The reactive species are formed from a halogen-containing gas mixture and the one or more interior surfaces include at least one surface having a coating material formed thereon. The method further comprises reacting the residual high-k dielectric material with the reactive species to form a volatile product. The method further comprises removing the volatile product from the processing chamber. The removal rate of the residual high-k dielectric material is greater than a removal rate of the coating material. The high-k dielectric material is selected from zirconium dioxide ($ZrO_2$) and hafnium dioxide ($HfO_2$). The coating material includes a compound selected from alumina ($Al_2O_3$), yttrium-containing compounds, and combinations thereof.

In yet another implementation, a method for cleaning a processing chamber is provided. The method comprises depositing a high-k dielectric material on one or more interior surfaces of a processing chamber and a substrate disposed in the substrate-processing chamber. The method further comprises transferring the substrate out of the substrate-processing chamber. The method further comprises introducing a reactive species into the processing chamber having the residual high-k dielectric material formed on one or more interior surfaces of the processing chamber. The reactive species are formed from a halogen-containing gas mixture and the one or more interior surfaces include at least one surface having a coating material formed thereon. The method further comprises reacting the residual high-k dielectric material with the reactive species to form a volatile product. The method further comprises removing the volatile product from the processing chamber. A removal rate of the residual high-k dielectric material is greater than a removal rate of the coating material. The high-k dielectric material is selected from zirconium dioxide ($ZrO_2$) and hafnium dioxide ($HfO_2$). The coating material includes a compound selected from alumina ($Al_2O_3$), yttrium-containing compounds, and combinations thereof.

In yet another implementation, a method for cleaning a processing chamber is provided. The method comprises flowing a halogen-containing cleaning gas mixture into a remote plasma source fluidly coupled with a processing chamber. The method further comprises forming reactive species from the halogen-containing cleaning gas mixture. The method further comprises transporting the reactive species into the processing chamber. The processing chamber has a residual high-k dielectric material formed on one or more interior surfaces of the processing chamber. The one or more interior surfaces include at least one surface having a coating material formed thereon. The method further comprises permitting the reactive species to react with the residual high-k dielectric material to form a product in a gaseous state. The method further comprises purging the product in a gaseous state out of the processing chamber. The high-k dielectric material is selected from zirconium dioxide ($ZrO_2$) and hafnium dioxide ($HfO_2$). The coating material includes a compound selected from alumina ($Al_2O_3$), yttrium-containing compounds, and combinations thereof.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes techniques for in-situ removal of residual high-k dielectric materials from a substrate-processing chamber. Certain details are set forth in the following description and figures to provide a thorough understanding of various implementations of the disclosure. Other details describing well-known structures and systems often associated with plasma cleaning are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a high-k dielectric deposition process that can be carried out using any suitable thin film deposition system. One example of such a system is an AKT-90K PECVD system, suitable for substrate size 3000 mm×3000 mm or larger size substrates, which is commercially available from Applied Materials, Inc., of Santa Clara, California. Another example of such a system is an AKT-25K PECVD system or AKT-25K ALD system, suitable for substrate size 1850 mm×1500 mm or larger size substrates, which are commercially available from Applied Materials, Inc., of Santa Clara, California. Other tools capable of performing high-k dielectric deposition processes may also be adapted to benefit from the implementations described herein. In addition, any system enabling high-k dielectric deposition processes described herein can be used to advantage. The apparatus description described herein is illustrative and should not be construed or interpreted as limiting the scope of the implementations described herein.

Implementations of the present disclosure generally relate to in-situ removal of high-k dielectric materials such as $ZrO_2$ and $HfO_2$ from processing chambers. The processing chambers include but are not limited to PECVD, ALD or other processing chambers, which are utilized in the fabrication of high-resolution display back-plane TFT circuits. $ZrO_2$ and $HfO_2$ are high-k dielectric materials currently used in the semiconductor industry and potentially in flat panel display industry to enable high-resolution display devices, such as Virtual Reality (VR) devices. High-k materials like $ZrO_2$ and $HfO_2$ are critical to enable high-resolution display devices (e.g., pixels per inch ("PPI")>2000). Currently, the area of the storage capacitor needs to be reduced in the pixel circuit as the whole pixel area shrinks to increase resolution. To achieve the same capacitance, current dielectric layers (e.g., SiN, dielectric constant (k)~7) used in storage capacitors are being replaced with high-k dielectric materials, such as $ZrO_2$ which has a k>20 and $HfO_2$ which has a k>25. One factor for enabling high-k dielectric materials in display applications is the efficient removal of residual high-k dielectric materials from the processing chamber to reduce particles and improve yield.

Typically, deposition of high-k dielectric materials is not limited to the substrate and forms a residual film throughout the chamber. This residual film can cause particle formation, uniformity degradation and gas inlet clogging, thus leading to yield loss and increased cost of ownership. One way to remove the unwanted residual film on the chamber wall or other chamber components is to dissemble the chamber and remove the films with solution or solvent periodically after several deposition cycles. Dissembling the chamber, cleaning the components and re-assembling the chamber take significant time and significantly affect the uptime of the tool. Another approach is to apply plasma to promote excitation and/or dissociation of reactive gases by the application of radio frequency (RF) energy. The plasma includes highly reactive species that react with and etch the unwanted residual material. For example, $NF_3$ plasma is widely used in the display industry to remove $SiO_x$ and $SiN_x$ films from processing chambers. However, $NF_3$ plasma is often unable to etch residual high-k dielectric materials.

Implementations of the present disclosure include both a chamber cleaning process and modification of current hardware materials. Some implementations of the present disclosure effectively remove residual high-k dielectric materials from the processing chamber by introducing a reactive species formed from a halogen-containing gas mixture into the processing chamber to react with the residual high-k dielectric material. The reactive species may be generated as in-situ plasma (e.g., formed inside the processing chamber) or ex-situ plasma (e.g., formed via a remote plasma source). The generation of plasma can be (but not limited to) inductive-coupled plasma (ICP), capacitive-coupled plasma (CCP), remote plasma source (RPS), or microwave plasma.

In some implementations of the present disclosure, residual high-k dielectric materials are removed by flowing a halogen-containing gas mixture into the processing chamber and then exciting and/or dissociating the halogen-containing gas mixture to form plasma in the processing chamber. The excited free radicals from the halogen-containing gas mixture etch the residual high-k dielectric materials from the chamber body. The plasma of the halogen-containing gas mixture etches the high-k dielectric material and aluminum, but typically does not etch or minimally etches the coating material (e.g., $Al_2O_3$) if no additional bias is applied. Therefore, in some implementations of the present disclosure, a thin coating material protects the aluminum chamber components during the cleaning process. The coating material may be applied using any suitable process. In some implementations, the coating material is applied by a surface anodization process, a plasma spray coating process, or a thermal spray coating process. If it is necessary to remove the coating material, additional bias can be applied to the plasma of the halogen-containing gas mixture during the process to facilitate etching of the coating material. Thus, the halogen-containing gas mixture can be used to selectively remove the high-k dielectric material relative to the coating material or remove both the high-k dielectric material and the coating material depending on the plasma conditions.

Figure 1A:
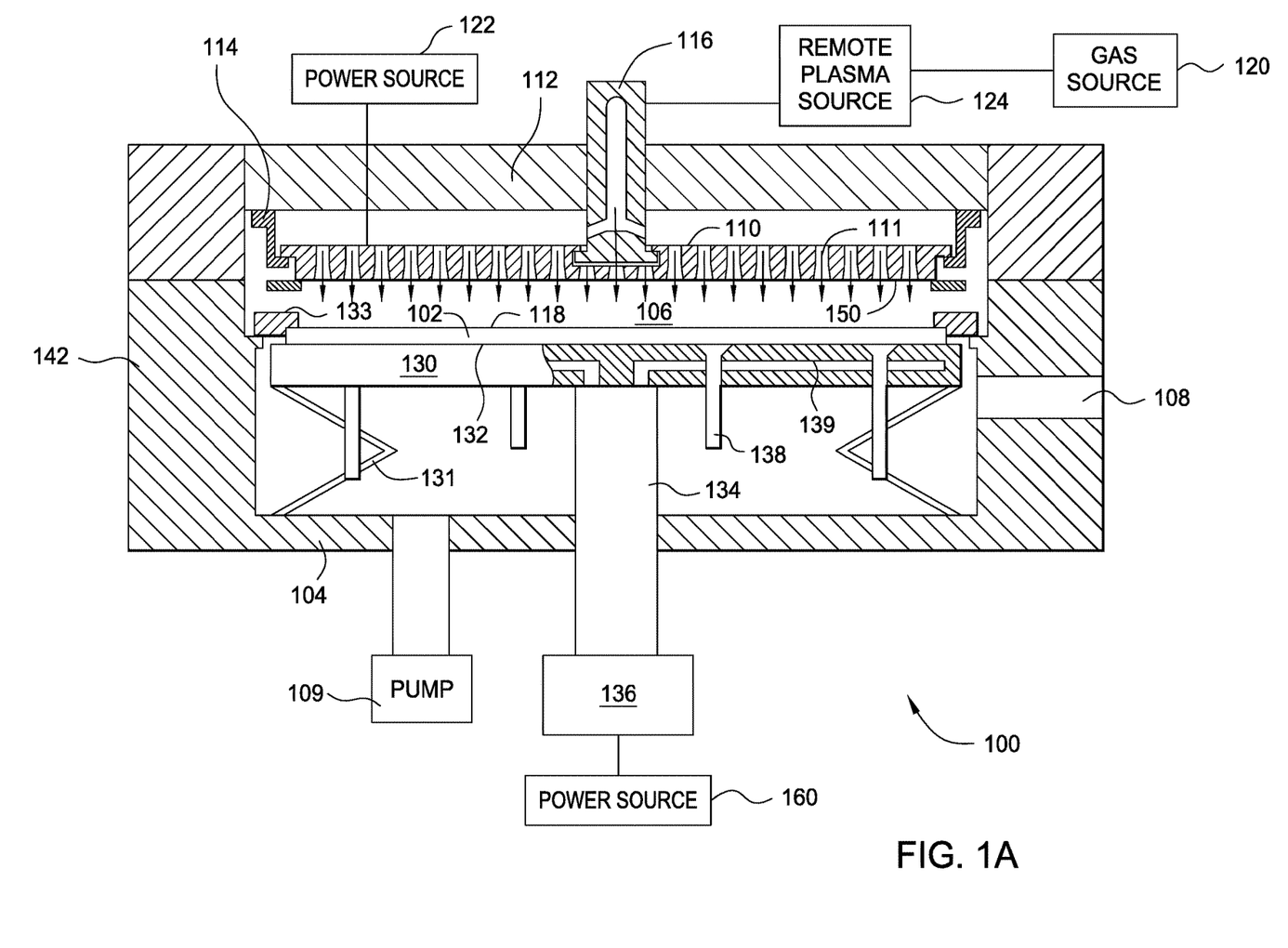
FIG. 1A depicts a sectional view of a processing chamber that may benefit from the cleaning processes in accordance with one or more implementations of the present disclosure.
Figure 1B:
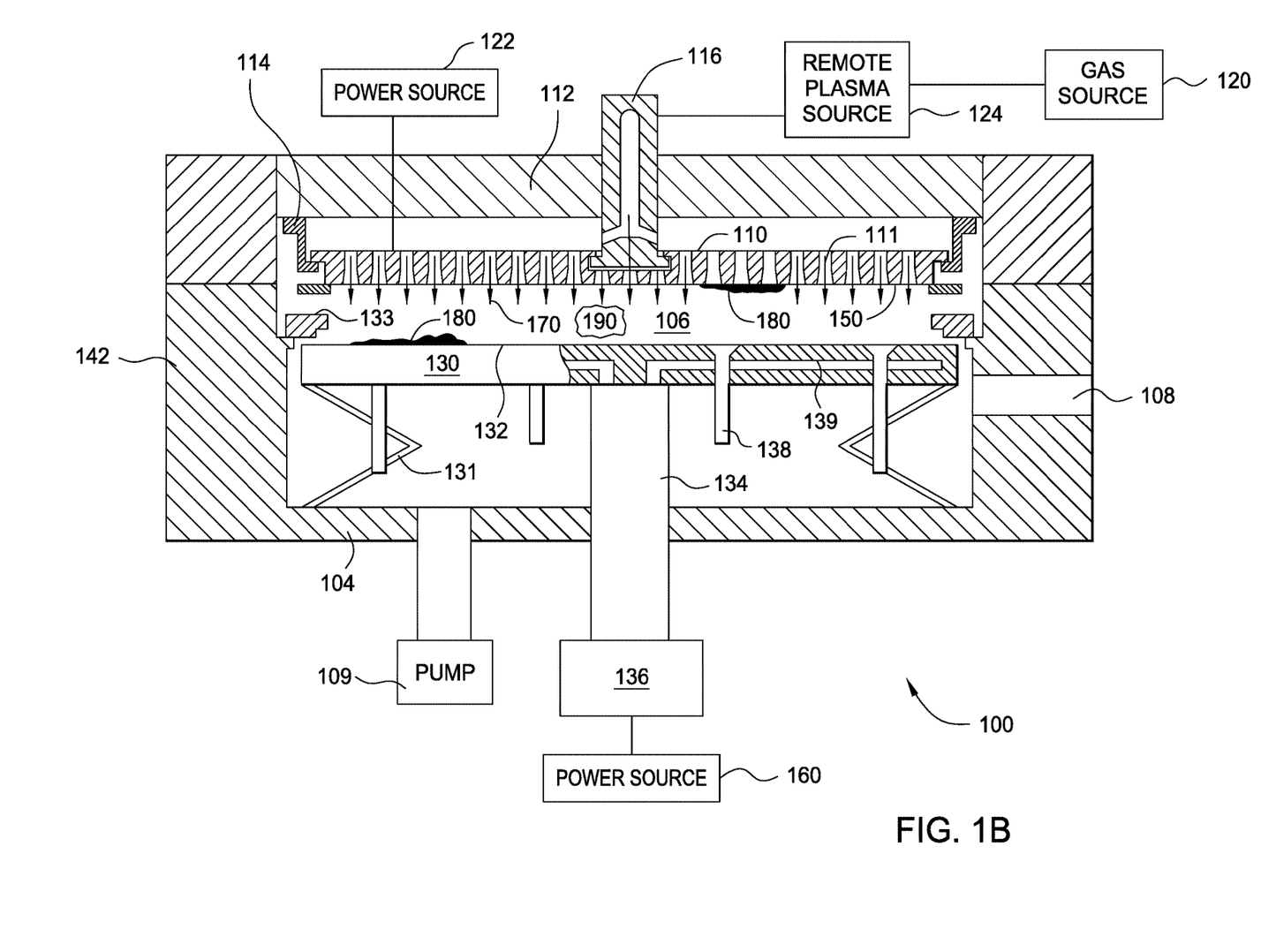
FIG. 1B depicts a sectional view of the processing chamber of FIG. 1A having residual high-k dielectric materials formed on one or more interior surfaces that may be removed using one or more implementations of the present disclosure.

FIG. 1A depicts a sectional view of a substrate-processing chamber 100 that may benefit from the cleaning processes in accordance with one or more implementations of the present disclosure. FIG. 1B depicts a sectional view of the substrate-processing chamber 100 of FIG. 1A having a residual film formed on one or more interior surfaces that may be removed using one or more implementations of the present disclosure. The substrate-processing chamber 100 may be used to perform CVD, plasma enhanced-CVD (PE-CVD), pulsed-CVD, ALD, PE-ALD, metal-organic chemical vapor deposition (MOCVD) or combinations thereof. In some implementations, the substrate-processing chamber may be configured to deposit a high-k dielectric layer, such as $ZrO_2$ or $HfO_2$. In some implementations, the substrate-processing chamber 100 is configured to process a large area substrate 102 (hereafter substrate 102) using plasma in forming structures and devices on the substrate 102 for use in the fabrication of liquid crystal displays (LCD's), flat panel displays, organic light emitting diodes (OLED's), or photovoltaic cells for solar cell arrays.

The substrate-processing chamber 100 generally includes sidewalls 142, a bottom wall 104 and a lid assembly 112, which define a process volume 106. In one implementation, the lid assembly 112 is generally comprised of aluminum. The lid assembly 112 may be anodized to form a layer of $Al_2O_3$ on the surface of the lid assembly 112. In another implementation, the lid assembly 112 is fabricated from stainless steel, nickel-iron alloys (e.g., Invar, which is a nickel-iron alloy known as 64FeNi), or other materials compatible with plasma processing. The sidewalls 142 and the bottom wall 104 may be fabricated from a unitary block of aluminum, stainless steel, nickel-iron alloys (e.g., Invar, which is a nickel-iron alloy known as 64FeNi), or other materials compatible with plasma processing. The sidewalls 142 and the bottom wall 104 may be anodized to form a coating material on the surface of the lid assembly 112. In some implementations, where the coating material is present, the coating material may be formed by an anodization process, a plasma spray process, or a thermal spray process. The coating material may include a compound selected from alumina ($Al_2O_3$), yttrium-containing compounds, and combinations thereof. The sidewalls 142 and the bottom wall 104 may be electrically grounded.

A gas distribution plate 110 and a substrate support assembly 130 are disposed within the process volume 106. The gas distribution plate 110 and/or the substrate support assembly 130 may each independently be fabricated from aluminum, stainless steel, nickel-iron alloys (e.g., Invar, which is a nickel-iron alloy known as 64FeNi), or other materials compatible with plasma processing. In one implementation, the substrate support assembly comprises stainless steel. In one implementation, the gas distribution plate 110 comprises stainless steel and the substrate support assembly comprises alumina ($Al_2O_3$), yttrium-containing compounds, or combinations thereof. The process volume 106 is accessed through a slit valve opening 108 formed through the sidewalls 142 such that the substrate 102 may be transferred into and out of the substrate-processing chamber 100.

The substrate support assembly 130 includes a substrate-receiving surface 132 for supporting the substrate 102 thereon. The substrate support assembly 130 generally comprises an electrically conductive body supported by a stem 134 that extends through the bottom wall 104. The stem 134 couples the substrate support assembly 130 to a lift system 136, which raises and lowers the substrate support assembly 130 between substrate transfer and processing positions. A shadow frame 133 may be placed over a periphery of the substrate 102 during processing to prevent deposition on the edge of the substrate 102. Lift pins 138 are moveably disposed through the substrate support assembly 130 and are adapted to space the substrate 102 from the substrate-receiving surface 132. The substrate support assembly 130 may also include heating and/or cooling elements 139 utilized to maintain the substrate support assembly 130 at a chosen temperature. The substrate support assembly 130 may also include grounding straps 131 to provide an RF return path around the periphery of the substrate support assembly 130. In one implementation, the substrate support assembly 130 has the coating disposed thereon.

The gas distribution plate 110 is coupled at its periphery to the lid assembly 112 or sidewalls 142 of the substrate-processing chamber 100 by a suspension 114. In one particular implementation, the gas distribution plate 110 is fabricated from aluminum. The surface of the gas distribution plate 110 may be anodized to form a coating material (e.g., $Al_2O_3$) on the surface of the gas distribution plate 110. In one implementation, the surface of the gas distribution plate 110 has an yttrium-containing coating ($Y_2O_3$) disposed thereon. The coating material may be formed on the surface of the gas distribution plate 110 by an anodization, plasma spray process, or thermal spray process. The gas distribution plate 110 may also be coupled to the lid assembly 112 by one or more center supports 116 to help prevent sag and/or control the straightness/curvature of the gas distribution plate 110. The gas distribution plate 110 may have different configurations with different dimensions. In an exemplary implementation, the gas distribution plate 110 has a quadrilateral plan shape. The gas distribution plate 110 has a downstream surface 150 having a plurality of apertures 111 formed through the gas distribution plate 110 and facing an upper surface 118 of the substrate 102 disposed on the substrate support assembly 130. The apertures 111 may have different shapes, number, densities, dimensions, and distributions across the gas distribution plate 110. In one implementation, a diameter of the apertures 111 may be selected between about 0.01 inch and about 1 inch.

A gas source 120 is coupled to the lid assembly 112 to provide gas through the lid assembly 112 and then through the apertures 111 formed in the gas distribution plate 110 to the process volume 106. A vacuum pump 109 is coupled to the substrate-processing chamber 100 to maintain the gas in the process volume 106 at a chosen pressure.

A first source of electric power 122 is coupled with the lid assembly 112 and/or to the gas distribution plate 110. The first source of electric power 122 provides power that creates an electric field between the gas distribution plate 110 and the substrate support assembly 130 so that a plasma may be generated from the gases present between the gas distribution plate 110 and the substrate support assembly 130. The lid assembly 112 and/or the gas distribution plate 110 electrode may be coupled to the first source of electric power 122 through an optional filter, which may be an impedance matching circuit. The first source of electric power 122 may be DC power, pulsed DC power, RF bias power, pulsed RF source or bias power, or a combination thereof. In one implementation, the first source of electric power 122 is a RF bias power.

In one implementation, the first source of electric power 122 is an RF power source. In one implementation, the first source of electric power 122 may be operated to provide RF power at a frequency between 0.3 MHz and about 14 MHz, such as about 13.56 MHz. The first source of electric power 122 may generate RF power at about 10 Watts to about 20,000 Watts, (e.g., between about 10 Watts to about 5000 Watts; between about 300 Watts to about 1500 Watts; or between about 500 Watts and about 1000 Watts).

The substrate support assembly 130 may be grounded such that RF power supplied by the first source of electric power 122 to the gas distribution plate 110 may excite the gases disposed in the process volume 106 between the substrate support assembly 130 and the gas distribution plate 110. The substrate support assembly 130 may be fabricated from metals or other comparable electrically conductive materials. In one implementation, at least a portion of the substrate support assembly 130 may be covered with an electrically insulative coating. The coating may be a dielectric material such as oxides, silicon nitride, silicon dioxide, aluminum oxide, aluminum dioxide, tantalum pentoxide, silicon carbide, polyimide, and yttrium-containing compounds, among others. Alternatively, the substrate-receiving surface 132 of the substrate support assembly 130 may be free of coating or anodizing.

An electrode (not shown), which may be a bias electrode and/or an electrostatic chucking electrode, may be coupled to the substrate support assembly 130. In one implementation, the electrode is positioned in the body of the substrate support assembly 130. The electrode may be coupled to a second source of electric power 160 through an optional filter, which may be an impedance matching circuit. The second source of electric power 160 may be used to establish additional bias by establishing additional electric potential from the plasma to the substrate 102. Although there is already built-in potential from the plasma to the substrate 102 even without the second source of electric power 160, it is believed that the second source of electric power 160 increases the bias to provide more ion bombardment to enhance the etching/cleaning effect. The second source of electric power 160 may be DC power, pulsed DC power, RF bias power, pulsed RF source or bias power, or a combination thereof.

In one implementation, the second source of electric power 160 is a DC bias source. The DC bias power may be supplied at between about 10 Watts and about 3000 Watts (e.g., between about 10 Watts and about 1000 Watts; or between about 10 Watts and about 100 Watts) at a frequency of 300 kHz. In one implementation, the DC bias power may be pulsed with a duty cycle between about 10 to about 95 percent at an RF frequency between about 500 Hz and about 10 kHz. Not to be bound by theory but it is believed that the DC bias establishes a bias between the plasma and substrate support, so that the ions in the plasma bombard the substrate support, enhancing the etching effect.

In one implementation, the second source of electric power 160 is a RF bias power. The RF bias power may be supplied at between about 0 Watts and about 1000 Watts (e.g., between about 10 Watts and about 100 Watts) at a frequency of 300 kHz. In one implementation, the RF bias power may be pulsed with a duty cycle between about 10 to about 95 percent at a RF frequency between about 500 Hz and about 10 kHz.

In one implementation, the edges of the downstream surface 150 of the gas distribution plate 110 may be curved so that a spacing gradient is defined between the edge and corners of the gas distribution plate 110 and substrate-receiving surface 132 and, consequently, between the gas distribution plate 110 and the upper surface 118 of the substrate 102. The shape of the downstream surface 150 may be selected to meet specific process requirements. For example, the shape of the downstream surface 150 may be convex, planar, concave or other suitable shape. Therefore, the edge to corner spacing gradient may be utilized to tune the film property uniformity across the edge of the substrate, correcting property non-uniformity in films disposed in the corner of the substrate. Additionally, the edge to center spacing may also be controlled so film property distribution uniformity may be controlled between the edge and center of the substrate. In one implementation, a concave curved edge of the gas distribution plate 110 may be used so the center portion of the edge of the gas distribution plate 110 is spaced farther from the upper surface 118 of the substrate 102 than the corners of the gas distribution plate 110. In another implementation, a convex curved edge of the gas distribution plate 110 may be used so that the corners of the gas distribution plate 110 are spaced farther than the edges of the gas distribution plate 110 from the upper surface 118 of the substrate 102.

A remote plasma source 124, such as an inductively coupled remote plasma source, may also be coupled between the gas source and the gas distribution plate 110. Between processing substrates, a halogen-containing cleaning gas mixture may be energized in the remote plasma source 124 to remotely provide plasma utilized to clean chamber components. The halogen-containing cleaning gas mixture entering the process volume 106 may be further excited by the RF power provided to the gas distribution plate 110 by the first source of electric power 122. Although gas source 120 is coupled to the lid assembly 112 via the remote plasma source 124, it should be understood that in some implementations, the gas source 120 is coupled directly to the lid assembly.

In one implementation, the substrate 102 that may be processed in the substrate-processing chamber 100 may have a surface area of 10,000 cm$^2$ or more, such as 25,000 cm$^2$ or more, for example about 55,000 cm$^2$ or more. It is understood that after processing the substrate may be cut to form smaller other devices.

In one implementation, the heating and/or cooling elements 139 may be set to provide a substrate support assembly temperature during cleaning of about 600 degrees Celsius or less (between about 10 degrees Celsius and about 300 degrees Celsius; between about 200 degrees Celsius and about 300 degrees Celsius; between about 10 degrees Celsius and about 50 degrees Celsius, or between about 10 degrees Celsius and 30 degrees Celsius).

The nominal spacing during cleaning between the upper surface 118 of the substrate 102 disposed on the substrate-receiving surface 132 and the gas distribution plate 110 may generally vary between 400 mils and about 1,200 mils, such as between 400 mils and about 800 mils, or other distance to obtain sought after cleaning results. In one implementation, where the gas distribution plate 110 has a concave downstream surface, the spacing between the center portion of the edge of the gas distribution plate 110 and the substrate-receiving surface 132 is between about 400 mils and about 1,400 mils, and the spacing between the corners of the gas distribution plate 110 and the substrate-receiving surface 132 is between about 300 mils and about 1,200 mils.

FIG. 1B depicts a sectional view of the substrate-processing chamber 100 of FIG. 1A with the substrate 102 removed. FIG. 1B provides an illustration of the substrate-processing chamber 100 suitable for performing chamber cleaning using an internal energy source such as in-situ plasma or an external energy source, respectively. In FIG. 1B, a halogen-containing gas mixture 170 (depicted in FIG. 1B as solid arrows) is introduced into the process volume 106, which has a residual film 180 (e.g., a high-k dielectric material such as $ZrO_2$, $Y_2O_3$, or $HfO_2$) to be removed during the cleaning process. As shown in FIG. 1B, the residual film 180 is deposited upon at least a portion of the exposed surface within the substrate-processing chamber 100, particularly, the gas distribution plate 110, substrate support assembly 130, shadow frame 133, etc. The halogen-containing gas mixture 170 is exposed to an energy source, such as the first source of electric power 122, the second source of electric power 160, or remote plasma source 124, which creates reactive species 190 such as chlorine radicals, fluorine radicals, bromine radicals, hydrogen radicals and combinations thereof. The reactive species 190 react with the residual film 180 and form a volatile product. The volatile product is removed from the substrate-processing chamber 100. One or more interior surfaces (e.g., the gas distribution plate 110, substrate support assembly 130, shadow frame 133, sidewalls 142, etc.) of the substrate-processing chamber 100 have at least one coating material (e.g., exposed $Al_2O_3$ film or exposed yttrium-containing films) formed thereon. The one or more interior surfaces may comprise aluminum, stainless steel, nickel-iron alloys (e.g., Invar or 64FeNi), or other materials compatible with plasma processing. In implementations, where the reactive species 190 are formed ex-situ (e.g., via remote plasma), the reactive species may be delivered into the process volume 106.

Figure 2:
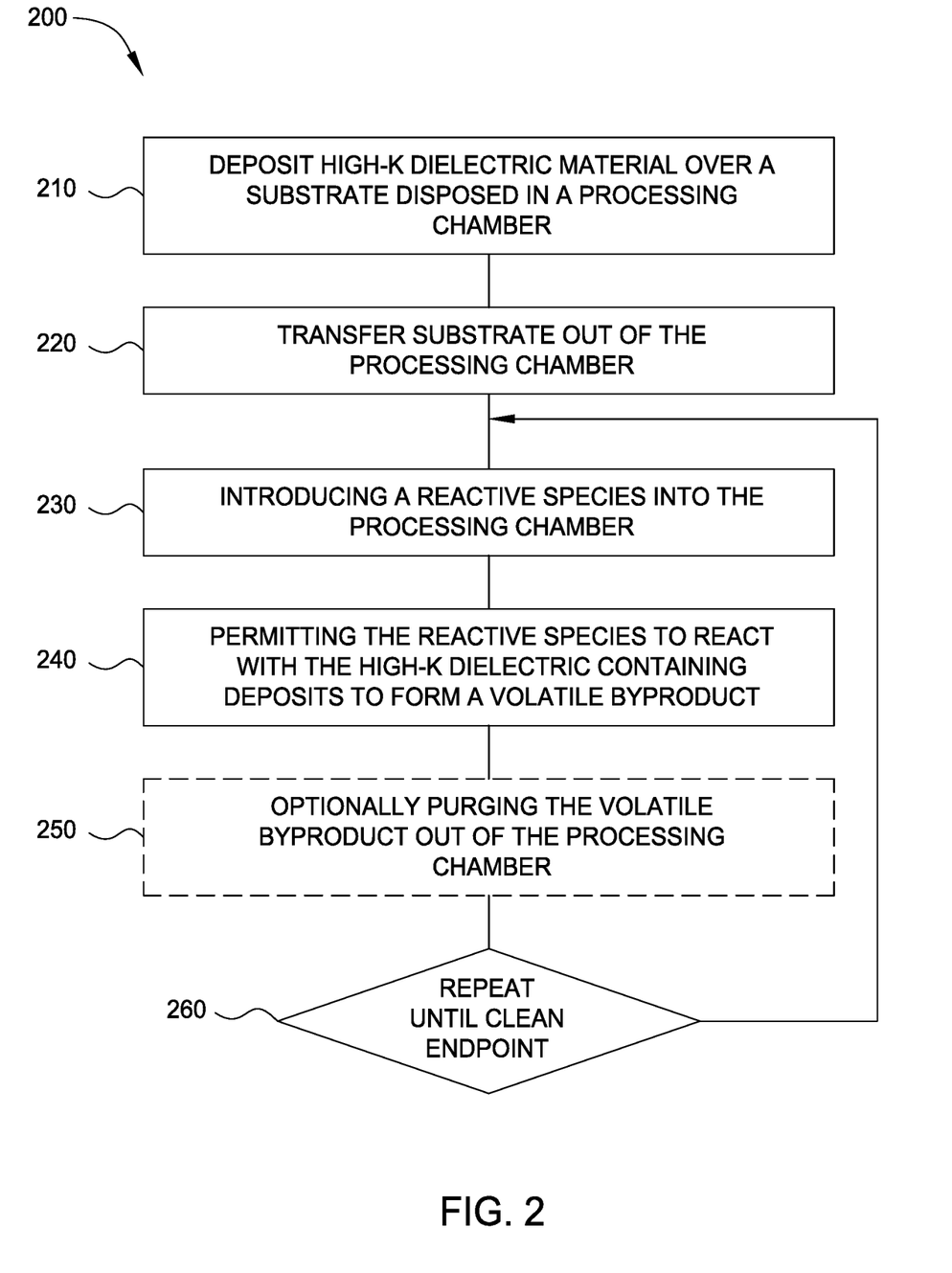
FIG. 2 depicts a process flow diagram of one implementation of a method that may be used to remove high-k dielectric materials from a processing chamber.

FIG. 2 depicts a process flow diagram of one implementation of a method 200 that may be used to remove high-k dielectric materials from a substrate-processing chamber. The substrate-processing chamber may be similar to the substrate-processing chamber 100 depicted in FIG. 1A and FIG. 1B. At operation 210, a high-k dielectric material is deposited over a substrate disposed in a substrate-processing chamber. During deposition of the high-k dielectric material over the substrate, the high-k dielectric material may be deposited over the interior surfaces including the chamber components (e.g., the gas distribution plate, substrate support assembly, shadow frame, sidewalls, etc.) of the substrate-processing chamber. The interior surfaces may comprise aluminum, stainless steel, nickel-iron alloys (e.g., Invar or 64FeNi), or other materials compatible with plasma processing. Any suitable high-k dielectric material may be deposited in the substrate-processing chamber. In one implementation, the high-k dielectric material is selected from zirconium oxide ($ZrO_2$), hafnium oxide ($HfO_2$), aluminum oxide ($Al_2O_3$), and combinations thereof. In one implementation, the high-k dielectric material is doped. In one implementation, the doped high-k dielectric material is an aluminum-doped zirconium oxide containing material.

The high-k dielectric material may be deposited using, for example, a chemical vapor deposition (CVD) process, a plasma-enhanced chemical vapor deposition (PECVD) process, an atomic layer deposition (ALD) process, a metal-organic chemical vapor deposition (MOCVD) process, and a physical vapor deposition (PVD) process. In some implementations, at least portions of the chamber components are composed of aluminum. In some implementations, at least portions of the chamber components have a coating disposed thereon. In some implementations, the coating includes a compound selected from alumina ($Al_2O_3$), yttrium-containing compounds, and combinations thereof. In one implementation, the yttrium-containing compound is selected from yttrium oxide ($Y_2O_3$), yttrium oxide fluoride (YOF), yttrium chlorate ($Y(ClO_3)_3$), yttrium (III) fluoride ($YF_3$), yttrium (III) chloride ($YCl_3$), yttria-stabilized zirconia (YSZ), and combinations thereof. In some implementations, the chamber components do not have a coating disposed thereon and thus are "coating-free."

At operation 220, the substrate is transferred out of the substrate-processing chamber. In some implementations, the substrate remains in the substrate-processing chamber during the cleaning process.

At operation 230, a reactive species is introduced into the substrate-processing chamber. The reactive species may be generated utilizing plasma. The plasma may be generated in-situ or the plasma may be generated ex-situ (e.g., remotely). Suitable plasma generation techniques and sources, such as inductive-coupled plasma (ICP), capacitive-coupled plasma (CCP), remote plasma source (RPS), or microwave plasma generation techniques may be utilized to form the reactive species. In some implementations, the reactive species are formed in-situ via an in-situ plasma process. In some implementations, the reactive species are formed ex-situ via a remote plasma source and introduced into the substrate-processing chamber.

In one implementation, the reactive species may be generated by flowing a halogen-containing cleaning gas mixture into the process volume 106. In one implementation, the halogen-containing cleaning gas mixture includes a halogen-containing gas. In one implementation, the halogen-containing gas is selected from a chlorine-containing gas, hydrogen bromide (HBr) gas, and combinations thereof. In one implementation, the chlorine-containing gas is selected from $BCl_3$ and $Cl_2$. In one implementation, the halogen-containing gas is selected from $BCl_3$, $Cl_2$, HBr, $NF_3$, and combinations thereof. In one implementation, the halogen-containing cleaning gas mixture includes $BCl_3$ and $NF_3$. In one implementation, the halogen-containing cleaning gas mixture includes $BCl_3$ and $Cl_2$. In one implementation, the halogen-containing gas mixture further comprises a carbon-containing gas. In one implementation, the carbon-containing gas is selected from $CO_2$, $CH_4$, $CHF_3$, $CH_2F_2$, $CH_3F$, $CF_4$, and combinations thereof. In one implementation, the halogen-containing gas mixture further comprises a dilution gas. The dilution gas may be selected from helium, argon, and combinations thereof. In some implementations, the halogen-containing gas and the carbon-containing gas are introduced separately into the process volume 106.

In one implementation, the halogen-containing cleaning gas mixture includes $BCl_3$ and at least one of $CO_2$, $CH_4$, $CHF_3$, $CH_2F_2$, $CH_3F$, $CF_4$, and combinations thereof. In another implementation, the halogen-containing cleaning gas mixture includes $Cl_2$ and at least one of $CO_2$, $CH_4$, $CHF_3$, $CH_2F_2$, $CH_3F$, $CF_4$, and combinations thereof. In yet another implementation, the halogen-containing cleaning gas mixture includes HBr and at least one of $CO_2$, $CH_4$, $CHF_3$, $CH_2F_2$, $CH_3F$, and combinations thereof. In yet another implementation, the halogen-containing cleaning gas mixture includes $NF_3$ and at least one of $CO_2$, $CH_4$, $CHF_3$, $CH_2F_2$, $CH_3F$, $CF_4$, and combinations thereof. In yet another implementation, the halogen-containing cleaning gas mixture includes $BCl_3$, $NF_3$ and at least one of $CO_2$, $CH_4$, $CHF_3$, $CH_2F_2$, $CH_3F$, $CF_4$, and combinations thereof. In yet another implementation, the halogen-containing cleaning gas mixture includes $BCl_3$, $Cl_2$ and at least one of $CO_2$, $CH_4$, $CHF_3$, $CH_2F_2$, $CH_3F$, $CF_4$, and combinations thereof.

In one implementation, the halogen-containing cleaning gas mixture is exposed to an RF source and/or bias power. The RF source and/or bias power energizes the halogen-containing cleaning gas mixture within the process volume 106 such that the plasma may be sustained. In one implementation, the first source of electric power 122 may be operated to provide RF power at a frequency between 0.3 MHz and about 14 MHz, such as about 13.56 MHz. The first source of electric power 122 may generate RF power at about 10 Watts to about 5000 Watts, (e.g., between about 300 Watts to about 1500 Watts; between about 500 Watts and about 1000 Watts).

In some implementations, in addition to the RF source power, RF bias power may also be utilized during the cleaning process to assist dissociating the cleaning gas mixture forming the plasma. The RF bias may be provided by the second source of electric power 160. In one implementation, the first source of electric power 122 may be operated to provide RF power at a frequency between 0.3 MHz and about 14 MHz, such as about 13.56 MHz. The RF bias power may be supplied at between about 0 Watts and about 1000 Watts (e.g., between about 10 Watts and about 100 Watts) at a frequency of 300 kHz. In one implementation, the RF bias power may be pulsed with a duty cycle between about 10 to about 95 percent at a RF frequency between about 500 Hz and about 10 kHz. In some implementations, where this additional bias is applied, the coating material (e.g., $Al_2O_3$) is removed in conjunction with the residual high-k dielectric material. Not to be bound by theory, but it is believed that the DC bias establishes an electrical potential difference between plasma and the substrate to enhance etching.

In some implementations, the plasma may be formed by capacitive or inductive means, and may be energized by coupling RF power into the halogen-containing cleaning gas mixture. The RF power may be a dual-frequency RF power that has a high frequency component and a low frequency component. The RF power is typically applied at a power level between about 50 W and about 2,500 W, which may be all high-frequency RF power, for example at a frequency of about 13.56 MHz, or may be a mixture of high-frequency power and low frequency power, for example at a frequency of about 300 kHz.

In some implementations, where the reactive species are formed ex-situ, the halogen-containing cleaning gas mixture is flowed into a remote plasma source fluidly coupled with the substrate-processing chamber. The halogen-containing cleaning gas mixture comprises a halogen-containing gas, optionally the carbon-containing gas, and optionally the dilution gas. In some implementations, the optional dilution gas may function as a carrier gas. In some implementations, the optional dilution gas may extend the lifetime of and increase the density of the radical species. In some implementations, the halogen-containing gas is flowed into the remote plasma source and the other process gases (e.g., carbon-containing gases) are delivered to the chamber separately.

The remote plasma source may be an inductively coupled plasma source. The remote plasma source accepts the halogen-containing cleaning gas mixture and forms a plasma in the halogen-containing cleaning gas mixture, which causes dissociation of the of the halogen-containing cleaning gas mixture to form reactive species. The reactive species may include chlorine radicals, bromine radicals, fluorine radicals and combinations thereof. The remote plasma source provides high efficiency dissociation of the halogen-containing cleaning gas mixture.

In some implementations, the remote plasma is initiated with an initial flow of argon or similar inert gas before introducing the halogen-containing cleaning gas mixture into the remote plasma chamber.

The halogen-containing cleaning gas mixture may be flowed into the substrate-processing chamber at a flow rate of about 100 sccm to about 20,000 sccm. In some implementations, the halogen-containing cleaning gas mixture is flowed into the substrate-processing chamber at a flow rate from about 500 sccm to about 4,000 sccm. In some implementations, the halogen-containing cleaning gas mixture is flowed into the substrate-processing chamber at a flow rate of about 1,000 sccm.

In one implementation, the pressure within the substrate-processing chamber is between about 10 mTorr and about 300 Torr. In one implementation, the pressure within the substrate-processing chamber is between 10 mTorr and about 5 Torr, for example, about 20 mTorr.

In some implementations, the remote plasma is initiated with an initial flow of argon or similar inert gas before introducing the halogen-containing gas mixture into the remote plasma source. Then, as the halogen-containing gas mixture is introduced into the remote plasma chamber, the flow rate of argon is decreased. As an example, the remote plasma may be initiated with a flow of 3,000 sccm of argon, which is progressively decreased to 1,000, and then to 500 sccm as the halogen-containing gas mixture is introduced into the remote plasma chamber at an initial flow rate of 1,000 sccm and then increased to a flow of 1,500 sccm.

In some implementations, the cleaning process is performed at room temperature. In some implementations, the substrate support pedestal is heated to a temperature of about 600 degrees Celsius or less, for example between about 10 degrees Celsius and about 200 degrees Celsius, or between about 10 degrees Celsius and about 50 degrees Celsius, such as between about 10 degrees Celsius and 30 degrees Celsius. Controlling the temperature may be used to control the removal/etching rate of the high-k dielectric material containing deposits. The removal rate may increase as the chamber temperature increases.

The reactive species formed from the halogen-containing cleaning gas mixture are transported to the substrate-processing chamber. In one implementation, the reactive species comprise halogen radicals. In one implementation, the reactive species comprise chlorine radicals. In one implementation, the reactive species comprise chlorine radicals and fluorine radicals. In one implementation, the reactive species comprises bromine radicals. In one implementation, the reactive species comprises bromine radicals and hydrogen radicals.

At operation 240, the reactive species react with the high-k dielectric material containing deposits to form a volatile product in gaseous state. In some implementations, a removal rate of the residual high-k dielectric material containing deposits is greater than a removal rate of the coating material, which coats at least a portion of the chamber components. In some implementations, the removal rate of the residual high-k dielectric containing deposits is greater than 200 Å/min (e.g., from about 200 Å/min to about 400 Å/min; from about 220 Å/min to about 300 Å/min; or from about 240 Å/min to about 300 Å/min). In some implementations, reacting the residual high-k dielectric containing deposits with the reactive species to form a volatile product is a bias-free process. In some implementations where no additional bias is applied, the removal rate of the coating material is less than 50 Å/minute (e.g., from about 0 Å/min to about 50 Å/min; from about 0 Å/min to about 10 Å/min, or zero A/min). In some implementations where no additional bias is applied, the removal rate of the coating material is a minimal or very slow removal rate (e.g., less than 50 Å/minute; less than 40 Å/minute; less than 30 Å/minute; less than 20 Å/minute; less than 20 Å/minute; less than 10 Å/minute; or less than 5 Å/minute).

Optionally, at operation 250, the volatile product, which is in a gaseous state, is purged out of the substrate-processing chamber. The substrate-processing chamber may be actively purged by flowing a purge gas into the substrate-processing chamber. Alternatively, or in addition to introducing the purge gas, the substrate-processing chamber may be depressurized in order to remove any residual cleaning gas as well as any byproducts from the substrate-processing chamber. The substrate-processing chamber may be purged by evacuating the substrate-processing chamber. The time-period of the purge process should generally be long enough to remove the volatile products from the substrate-processing chamber. The time-period of purge gas flow should be generally long enough to remove the volatile products from the interior surfaces of the chamber including the chamber components.

At operation 260, at least one of operation 230, operation 240, and operation 250 are repeated until a chosen cleaning endpoint is achieved. It should be understood that several cycles of cleaning may apply with an optional purge process performed in between cleaning cycles.

In some implementations, the method 200 further comprises removing the coating material (if present) from the substrate-processing chamber. The coating material is removed by applying an additional bias while forming the reactive species and/or while reacting the coating material with the reactive species to form a second volatile product. The second volatile product may be removed from the substrate-processing chamber.

Figure 3:
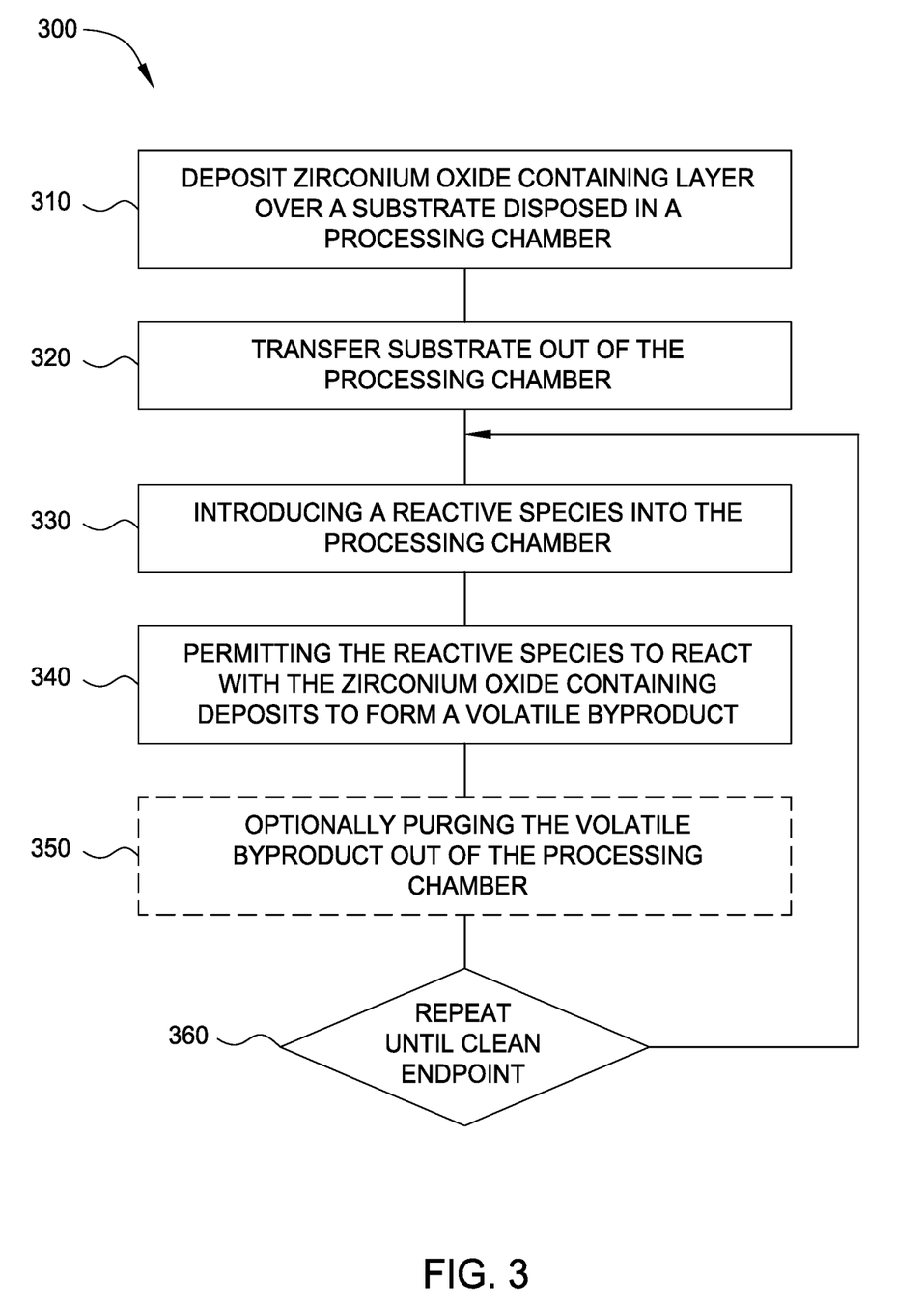
FIG. 3 depicts a process flow diagram of another implementation of a method that may be used to remove high-k dielectric materials from a processing chamber.

FIG. 3 depicts a process flow diagram of one implementation of a method 200 that may be used to remove high-k materials from a substrate-processing chamber. The substrate-processing chamber may be similar to the substrate-processing chamber 100 depicted in FIG. 1A and FIG. 1B. At operation 310, a zirconium oxide ($ZrO_2$) containing layer is deposited over a substrate disposed in a substrate-processing chamber. During deposition of the zirconium oxide containing layer over the substrate, zirconium oxide and/or zirconium oxide containing compounds may be deposited over the interior surfaces including the chamber components (e.g., the gas distribution plate, substrate support assembly, shadow frame, sidewalls, etc.) of the substrate-processing chamber. The zirconium oxide containing layer may be an aluminum-doped zirconium oxide containing layer. The zirconium oxide containing layer may be deposited using, for example, a chemical vapor deposition (CVD) process, a plasma-enhanced chemical vapor deposition (PECVD) process, chamber, an atomic layer deposition (ALD) process, a metal-organic chemical vapor deposition (MOCVD), and a physical vapor deposition (PVD) process. The one or more interior surfaces/chamber components may comprise aluminum, stainless steel, nickel-iron alloys (e.g., Invar or 64FeNi), or other materials compatible with plasma processing. In some implementations, at least portions of the chamber components are composed of aluminum. In some implementations, at least portions of the chamber components have an alumina ($Al_2O_3$) layer disposed thereon. In some implementations, at least portions of the chamber components are composed of stainless steel.

At operation 320, the substrate is transferred out of the substrate-processing chamber. In some implementation, the substrate remains in the substrate-processing chamber during the cleaning process.

At operation 330, a reactive species is introduced into the substrate-processing chamber. The reactive species may be generated utilizing plasma generated in-situ or the plasma may be generated ex-situ (e.g., remotely). Suitable plasma generation techniques, such as inductive-coupled plasma (ICP), capacitive-coupled plasma (CCP), remote plasma source (RPS), or microwave plasma generation techniques may be utilized to form the reactive species. In some implementations, the reactive species are formed in-situ via an in-situ plasma process. In some implementations, the reactive species are formed ex-situ via a remote plasma source.

In one implementation, the reactive species may be generated by flowing a cleaning gas mixture into the process volume 106. In one implementation, the cleaning gas mixture comprises $BCl_3$ and optionally a diluent gas. The diluent gas may be an inert gas selected from helium, argon, or combinations thereof. The cleaning gas mixture is exposed to an RF source and/or bias power. The RF source and/or bias power energizes the cleaning gas mixture within the process volume 106 such that the plasma may be sustained. In one implementation, the first source of electric power 122 may be operated to provide RF power at a frequency between 0.3 MHz and about 14 MHz, such as about 13.56 MHz. The first source of electric power 122 may generate RF power at about 10 Watts to about 5000 Watts, (e.g., between about 300 Watts to about 1500 Watts; between about 500 Watts and about 1000 Watts).

In some implementations, in addition to the RF source power, RF bias power may also be utilized during the cleaning process to assist dissociating the cleaning gas mixture forming the plasma. The RF bias may be provided by the second source of electric power 160. In one implementation, the first source of electric power 122 may be operated to provide RF power at a frequency between 0.3 MHz and about 14 MHz, such as about 13.56 MHz. The RF bias power may be supplied at between about 0 Watts and about 1000 Watts (e.g., between about 10 Watts and about 100 Watts) at a frequency of 300 kHz. In one implementation, the RF bias power may be pulsed with a duty cycle between about 10 to about 95 percent at a RF frequency between about 500 Hz and about 10 kHz. In some implementations, where this additional bias is applied, $Al_2O_3$ is removed in conjunction with the residual $ZrO_2$ containing film.

In some implementations, in addition to the RF source power, DC bias power may also be utilized during the cleaning process to assist dissociating the cleaning gas mixture forming the plasma. The DC bias may be provided by the second source of electric power 160. In one implementation, the first source of electric power 122 may be operated to provide RF power at a frequency between 0.3 MHz and about 14 MHz, such as about 13.56 MHz. The second source of electric power 160 may be operated to provide DC bias power at between about 10 Watts and about 3000 Watts (e.g., between about 10 Watts and about 1000 Watts; or between about 10 Watts and about 100 Watts) at a frequency of 300 kHz. In one implementation, the DC bias power may be pulsed with a duty cycle between about 10 to about 95 percent at a frequency between about 500 Hz and about 10 kHz. Not to be bound by theory, but it is believed that the DC bias establishes an electrical potential difference between plasma and the substrate to enhance etching.

In some implementations, the plasma may be formed by capacitive or inductive means, and may be energized by coupling RF power into the cleaning gas mixture. The RF power may be a dual-frequency RF power that has a high frequency component and a low frequency component. The RF power is typically applied at a power level between about 50 W and about 2,500 W, which may be all high-frequency RF power, for example at a frequency of about 13.56 MHz, or may be a mixture of high-frequency power and low frequency power, for example at a frequency of about 300 kHz.

In some implementations, where the reactive species are formed ex-situ, the $BCl_3$ containing gas mixture is flowed into a remote plasma source fluidly coupled with the substrate-processing chamber. The $BCl_3$ containing gas mixture comprises $BCl_3$ and optionally an inert gas. In some implementations, the optional inert gas may function as a carrier gas. In some implementations, the optional inert gas may extend the lifetime of and increase the density of the radical species. In some implementations, the $BCl_3$ containing gas mixture is flowed into the remote plasma source and the other process gases are delivered to the chamber separately. The optional inert gas may be selected from the group consisting of helium, argon, or combinations thereof.

The remote plasma source may be an inductively coupled plasma source. The remote plasma source accepts the $BCl_3$ containing gas mixture and forms a plasma in the $BCl_3$ containing gas mixture, which causes dissociation of the of the $BCl_3$ containing gas mixture to form reactive species. The reactive species may include chlorine radicals. The remote plasma source provides high efficiency dissociation of the $BCl_3$ containing gas mixture.

In some implementations, the remote plasma is initiated with an initial flow of argon or similar inert gas before introducing the $BCl_3$ containing gas mixture into the remote plasma chamber.

The $BCl_3$ containing gas mixture may be flowed into the substrate-processing chamber at a flow rate of about 100 sccm to about 10,000 sccm. In some implementations, the $BCl_3$ containing gas mixture is flowed into the substrate-processing chamber at a flow rate from about 500 sccm to about 4,000 sccm. In some implementations, the $BCl_3$ containing gas mixture is flowed into the substrate-processing chamber at a flow rate of about 1,000 sccm.

The pressure within the substrate-processing chamber may be between about 10 mTorr and about 300 Torr. The pressure within the substrate-processing chamber may be between 10 mTorr and about 5 Torr, for example, about 20 mTorr.

In some implementations, the remote plasma is initiated with an initial flow of argon or similar inert gas before introducing $BCl_3$ into the remote plasma source. Then, as $BCl_3$ is introduced into the remote plasma chamber, the flow rate of argon is decreased. As an example, the remote plasma may be initiated with a flow of 3,000 sccm of argon which is progressively decreased to 1,000 and then to 500 sccm as $BCl_3$ is introduced into the remote plasma chamber at an initial flow rate of 1,000 sccm and then increased to a flow of 1,500 sccm.

In some implementations, the cleaning process is performed at room temperature. In some implementations, the substrate support pedestal is heated to a temperature of about 600 degrees Celsius or less, for example between about 10 degrees Celsius and about 200 degrees Celsius, or between about 10 degrees Celsius and about 50 degrees Celsius, such as between about 10 degrees Celsius and 30 degrees Celsius. Controlling the temperature may be used to control the removal/etching rate of the high-k dielectric material deposits. The removal rate may increase as the chamber temperature increases.

The reactive species formed from the $BCl_3$ gas mixture are transported to the substrate-processing chamber. The reactive species comprise chlorine radicals.

At operation 340, the reactive species react with the zirconium oxide containing deposits to form a volatile product in gaseous state. The volatile product includes zirconium tetrachloride ($ZrCl_4$). In some implementations, a removal rate of the residual $ZrO_2$ containing film is greater than a removal rate of the $Al_2O_3$, which coats at least a portion of the aluminum chamber components. In some implementations, the removal rate of the residual $ZrO_2$ containing film is greater than 200 Å/min (e.g., from about 200 Å/min to about 400 Å/min; from about 220 Å/min to about 300 Å/min; or from about 240 Å/min to about 300 Å/min). In some implementations, reacting the residual $ZrO_2$ containing film with the reactive species to form a volatile product is a bias-free process. In some implementations where no additional bias is applied, the removal rate of $Al_2O_3$ is less than 50 Å/minute (e.g., from about 0 Å/min to about 50 Å/min; from about 0 Å/min to about 10 Å/min, or zero A/min).

Optionally, at operation 350, the volatile product, which is in a gaseous state, is purged out of the substrate-processing chamber. The substrate-processing chamber may be actively purged by flowing a purge gas into the substrate-processing chamber. Alternatively, or in addition to introducing the purge gas, the substrate-processing chamber may be depressurized in order to remove any residual cleaning gas as well as any byproducts from the substrate-processing chamber. The substrate-processing chamber may be purged by evacuating the substrate-processing chamber. The time-period of the purge process should generally be long enough to remove the volatile products from the substrate-processing chamber. The time-period of purge gas flow should be generally long enough to remove the volatile products from the interior surfaces of the chamber including the chamber components.

At operation 360, at least one of operation 330, operation 340, and operation 350 are repeated until a chosen cleaning endpoint is achieved. It should be understood that several cycles of cleaning may apply with an optional purge process performed in between cleaning cycles.

In some implementations, the method 300 further comprises removing the $Al_2O_3$ containing film (if present) from the substrate-processing chamber. The $Al_2O_3$ is removed by applying an additional bias while forming the reactive species and/or while reacting the $Al_2O_3$ containing film with the reactive species to form a second volatile product. The second volatile product may be removed from the substrate-processing chamber.

Examples

The following non-limiting examples are provided to further illustrate implementations described herein. However, the examples are not intended to be all-inclusive and are not intended to limit the scope of the implementations described herein. Table I depicts the results for a cleaning process performed according to one implementation of the present disclosure. As depicted in Table I, an inductively coupled plasma process performed with $BCl_3$ and without DC bias has a higher removal rate for $ZrO_2$, aluminum-doped $ZrO_2$ and aluminum relative to $Al_2O_3$. As further depicted in Table 1, when DC bias is applied, the process also removes $Al_2O_3$.

TABLE I

| | Process | | | |
|---|---|---|---|---|
| | ICP $BCl_3$ without DC bias | | | $BCl_3$ with DC bias |
| Material | $ZrO_2$ | Al doped $ZrO_2$ | Aluminum | $Al_2O_3$ | $Al_2O_3$ |
| Etch Rate | 240 Å/min | 220 Å/min | 410 Å/min | 0 Å | 600 Å |

Table II depicts the results for a cleaning process performed according to one implementation of the present disclosure. As depicted in Table II, a capacitively coupled plasma process performed with $BCl_3$ and without DC bias has a higher removal rate for $ZrO_2$, aluminum-doped $ZrO_2$ and aluminum relative to $Al_2O_3$, stainless steel, Invar and yttrium coating.

TABLE II

| | Process | | | | | | | | |
|---|---|---|---|---|---|---|---|---|---|
| | CCP $BCl_3$ without DC bias | | | | | | | | |
| Material | $ZrO_2$ | Aluminum | $Al_2O_3$ | Al-doped $ZrO_2$ | $SiO_2$ | Invar | SST | $Y_2O_3$ | YOF |
| Etch Rate | 200-300 Å/min | ~400 | ~180 Å/min | ~220 Å/min | ~160 Å/min | ~3 Å/min | ~0 Å/min | ~0 Å/min | ~0 Å/min |

In summary, some benefits of the present disclosure include the ability to selectivity etch residual high-k dielectric films (e.g., $ZrO_2$ and $HfO_2$) without or with minimal etching of chamber coating materials (e.g., $Al_2O_3$ and/or yttrium-containing compounds) and/or chamber materials (e.g., stainless steel and/or nickel-iron alloys). This selectivity can be used to protect aluminum chamber components. Aluminum chamber components are typically etched during plasma cleaning processes. The inventors have found that using $Al_2O_3$ anodization or other chamber coating materials to protect aluminum components in the chamber allows for the preferential removal of residual high-k dielectric films without damaging aluminum components, which ensures the reliability and lifetime of hardware parts. Selectivity is central to enable the in-situ cleaning capability. Thus, during cleaning, the residual films can be removed by the cleaning agent (e.g., $BCl_3$, $Cl_2$, HBr, or $NF_3$), but the aluminum sidewalls and other aluminum hardware components inside the chamber remain intact. As mentioned above, implementations of the present disclosure include using reactive plasma species from a halogen-containing gas mixture to clean residual high-k dielectric films, and using coating materials on aluminum hardware parts inside the chamber to protect the aluminum hardware parts. The reactive plasma species can effectively etch high-k dielectric materials and aluminum, but does not etch the coating material if no additional bias is applied. Thus, aluminum can be used as the material of hardware parts, as long as it is coated with a coating material (e.g., $Al_2O_3$ and/or yttrium-containing compounds). When additional bias is applied, the reactive plasma species can also etch $Al_2O_3$. These features make the reactive plasma species an ideal cleaning agent for in-situ cleaning of high-k materials form deposition chambers.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the present disclosure may be devised without departing from the basic scope thereof, and the scope thereof is determined by the claims that follow.

The invention claimed is:

1. A method for cleaning a processing chamber, comprising:
introducing a reactive species into a process volume of the processing chamber having a residual high-k dielectric material formed over one or more interior surfaces that define the process volume of the processing chamber, wherein the one or more interior surfaces comprise a stainless steel surface of at least one sidewall and at least one aluminum surface coated with a protective coating, wherein the protective coating comprises an alumina material disposed on the aluminum surface and a yttrium-containing material disposed on the alumina material, and wherein the at least one aluminum surface comprises a substrate-receiving surface of a substrate support assembly;
reacting the residual high-k dielectric material with the reactive species to form a volatile product; and
removing the volatile product from the processing chamber,
wherein a removal rate of the residual high-k dielectric material is greater than a removal rate of the yttrium-containing material coated on the at least one aluminum surface,
wherein the reactive species is formed from a halogen-containing gas mixture, and
wherein the residual high-k dielectric material is selected from zirconium dioxide ($ZrO_2$) and hafnium dioxide ($HfO_2$).

2. The method of claim 1, wherein the yttrium-containing material is selected from yttrium oxide ($Y_2O_3$), yttrium oxide fluoride (YOF), yttrium chlorate ($Y(ClO_3)_3$), yttrium (III) fluoride ($YF_3$), yttrium (III) chloride ($YCl_3$), yttria-stabilized zirconia (YSZ), and combinations thereof.

3. The method of claim 1, wherein the halogen-containing gas mixture comprises a halogen-containing gas selected from $BCl_3$, $Cl_2$, HBr, $NF_3$, and combinations thereof.

4. The method of claim 3, wherein the halogen-containing gas mixture further comprises a carbon-containing gas.

5. The method of claim 4, wherein the carbon-containing gas is selected from $CO_2$, $CH_4$, $CHF_3$, $CH_2F_2$, $CH_3F$, $CF_4$, and combinations thereof.

6. The method of claim 4, wherein the halogen-containing gas mixture further comprises a dilution gas selected from helium, argon, and combinations thereof.

7. The method of claim 1, wherein the halogen-containing gas mixture comprises $BCl_3$ and $NF_3$.

8. The method of claim 1, further comprising exposing the reactive species to one or more energy sources sufficient to react the residual high-k dielectric material with the reactive species and form the volatile product.

9. The method of claim 8, wherein the one or more energy sources are selected from a capacitive-coupled plasma source, an inductive-coupled plasma source, a microwave plasma source, and a remote plasma source.

10. The method of claim 1, wherein a pressure of the reacting the residual high-k dielectric material with the reactive species to form a volatile product is between at least about 10 mTorr and about 5 Torr.

11. The method of claim 1, wherein the processing chamber is a plasma-enhanced chemical vapor deposition (PECVD) chamber, an atomic layer deposition (ALD) chamber, a metal-organic chemical vapor deposition (MOCVD) chamber, and a physical vapor deposition (PVD) chamber.

12. A method for cleaning a processing chamber, comprising:
depositing a residual high-k dielectric material on one or more interior surfaces that define a process volume of the processing chamber and a substrate disposed over a substrate-receiving surface of a substrate support assembly in the processing chamber;
transferring the substrate out of the processing chamber;
introducing a reactive species into the process volume of the processing chamber having the residual high-k dielectric material formed over the one or more interior surfaces of the processing chamber, wherein the one or more interior surfaces comprise;
at least one aluminum surface coated with a protective coating comprising an alumina material disposed on the aluminum surface and a yttrium-containing material disposed on the alumina material, wherein the at least one aluminum surface comprises the substrate-receiving surface of the substrate support assembly, and
at least one stainless steel surface of at least one sidewall;

reacting the residual high-k dielectric material with the reactive species to form a volatile product without applying DC bias power; and removing the volatile product from the processing chamber, wherein a removal rate of the residual high-k dielectric material is greater than a removal rate of the yttrium-containing material coated on the at least one aluminum surface, wherein the residual high-k dielectric material is selected from zirconium dioxide ($ZrO_2$) and hafnium dioxide ($HfO_2$), wherein the reactive species is formed from a halogen-containing gas mixture, consisting of:

a halogen-containing gas selected from $BCl_3$, $Cl_2$, HBr, $NF_3$, or a combination thereof, optionally a carbon-containing gas selected from $CH_4$, $CHF_3$, $CH_2F_2$, $CH_3F$, $CF_4$, or a combination thereof, and optionally a dilution gas selected from helium, argon, or a combination thereof.

13. The method of claim 12, wherein the removal rate of the yttrium-containing material is less than 50 Å/minute.

14. The method of claim 12, wherein reacting the residual high-k dielectric material with the reactive species to form a volatile product further comprises exposing the reactive species to one or more energy sources sufficient to react the residual high-k dielectric material with the reactive species and form a volatile product.

15. The method of claim 14, wherein the one or more energy sources are selected from a capacitive-coupled plasma source, an inductive-coupled plasma source, a microwave plasma source, and a remote plasma source.

16. The method of claim 12, further comprising:

reacting the yttrium-containing material with the reactive species to form a second volatile product while applying an additional bias; and removing the second volatile product from the processing chamber.

17. The method of claim 12, wherein the yttrium-containing material is selected from yttrium oxide ($Y_2O_3$), yttrium oxide fluoride (YOF), yttrium chlorate ($Y(ClO_3)_3$), yttrium (III) fluoride ($YF_3$), yttrium (III) chloride ($YCl_3$), yttria-stabilized zirconia (YSZ), and combinations thereof.

18. A method for cleaning a processing chamber, comprising:

flowing a halogen-containing cleaning gas mixture into a remote plasma source fluidly coupled with the processing chamber, the halogen-containing cleaning gas mixture consisting of:

a halogen-containing gas selected from $BCl_3$, $Cl_2$, HBr, $NF_3$, or a combination thereof, optionally a carbon-containing gas selected from $CH_4$, $CHF_3$, $CH_2F_2$, $CH_3F$, $CF_4$, or a combination thereof, and optionally a dilution gas selected from helium, argon, or a combination thereof;

forming reactive species from the halogen-containing cleaning gas mixture;

transporting the reactive species into a process volume of the processing chamber, wherein the processing chamber has a residual high-k dielectric material formed over one or more interior surfaces that define the process volume of the processing chamber, wherein the one or more interior surfaces comprise;

at least one aluminum surface coated with a protective coating comprising an alumina material disposed on the aluminum surface and a yttrium-containing material disposed on the alumina material, wherein the at least one aluminum surface comprises a substrate-receiving surface of a substrate support assembly, and at least one stainless steel surface of at least one sidewall;

permitting the reactive species to react with the residual high-k dielectric material to form a product in a gaseous state without applying DC bias power; and purging the product in the gaseous state out of the processing chamber, wherein the residual high-k dielectric material is selected from zirconium dioxide ($ZrO_2$) and hafnium dioxide ($HfO_2$).

19. The method of claim 18, wherein a removal rate of the yttrium-containing material is less than 50 Å/minute.

20. The method of claim 18, wherein the yttrium-containing material is selected from yttrium oxide ($Y_2O_3$), yttrium oxide fluoride (YOF), yttrium chlorate ($Y(ClO_3)_3$), yttrium (III) fluoride ($YF_3$), yttrium (III) chloride ($YCl_3$), yttria-stabilized zirconia (YSZ), and combinations thereof.

* * * * *